(12) United States Patent
Na et al.

(10) Patent No.: US 8,523,158 B2
(45) Date of Patent: Sep. 3, 2013

(54) OPENER AND BUFFER TABLE FOR TEST HANDLER

(75) Inventors: Yun-Sung Na, Cheonan-Si (KR); In-Gu Jeon, Suwon (KR); Seung-Chul Ahn, Suwon Si (KR); Dong-Han Kim, Suwon-Si (KR); Jae-Hyun Son, Seoul (KR)

(73) Assignee: TechWing., Co. Ltd., Hwaseong-Si (KR)

( * ) Notice: Subject to any disclaimer, the term of this patent is extended or adjusted under 35 U.S.C. 154(b) by 605 days.

(21) Appl. No.: 12/666,124

(22) PCT Filed: Jul. 2, 2008

(86) PCT No.: PCT/KR2008/003888
§ 371 (c)(1),
(2), (4) Date: Dec. 22, 2009

(87) PCT Pub. No.: WO2009/011508
PCT Pub. Date: Jan. 22, 2009

(65) Prior Publication Data
US 2010/0320348 A1 Dec. 23, 2010

(30) Foreign Application Priority Data

Jul. 16, 2007 (KR) ........................ 10-2007-0071366

(51) Int. Cl.
| | |
|---|---|
| *B23Q 1/64* | (2006.01) |
| *B23Q 3/00* | (2006.01) |
| *B23Q 3/02* | (2006.01) |
| *B25B 1/22* | (2006.01) |
| *B25B 1/00* | (2006.01) |
| *B25B 11/00* | (2006.01) |
| *G01R 31/00* | (2006.01) |
| *H01R 13/648* | (2006.01) |

(52) U.S. Cl.
USPC ............. 269/56; 269/43; 269/21; 269/310; 269/309; 269/289 R; 269/302.1; 269/71; 269/95; 269/20; 324/756.01; 324/756.02; 439/607.14

(58) Field of Classification Search
USPC ............. 269/56.21, 310, 309.289 R, 302.1, 269/71, 95, 20, 21, 43; 439/607.14; 324/756.01, 756.02
See application file for complete search history.

(56) References Cited

U.S. PATENT DOCUMENTS

| | | | |
|---|---|---|---|
| 6,104,204 A | | 8/2000 | Hayama et al. |
| 6,196,536 B1 * | | 3/2001 | Hintze .................. 269/282 |

(Continued)

FOREIGN PATENT DOCUMENTS

| | | |
|---|---|---|
| KR | 10-2003-0012438 A | 2/2003 |
| KR | 10-2003-0040913 A | 5/2003 |

(Continued)

*Primary Examiner* — Monica Carter
*Assistant Examiner* — Nirvana Deonauth
(74) *Attorney, Agent, or Firm* — Jefferson IP Law, LLP (57) ABSTRACT

An opener and a buffer table for a test handler are disclosed. The opener includes an opening plate, a plurality of pin blocks forming pairs, and at least one or more interval retaining apparatus for retaining an interval between the pin blocks forming a pair. Each of the pin blocks is movably coupled to the opening plate, and includes opening pins for releasing a holding state of a holding apparatus that holds semiconductor devices in a carrier board. Although semiconductor devices to be tested are altered in size and a carrier board loading with the semiconductor devices is thus replaced, the opener does not need to be replaced, thereby reducing the replacement cost and the waste of resources.

6 Claims, 6 Drawing Sheets

(56) References Cited

U.S. PATENT DOCUMENTS

| | | | |
|---|---|---|---|
| 6,241,825 B1* | 6/2001 | Wytman | 118/733 |
| 6,250,619 B1* | 6/2001 | Cook et al. | 269/20 |
| 6,262,571 B1* | 7/2001 | Krajec | 324/754.08 |
| 6,293,534 B1* | 9/2001 | Leban | 269/309 |
| 6,437,593 B1 | 8/2002 | Ito et al. | |
| 6,672,576 B1* | 1/2004 | Walker | 269/21 |
| 6,819,099 B1* | 11/2004 | Repko et al. | 324/750.25 |
| 2004/0183056 A1* | 9/2004 | Funk et al. | 254/88 |
| 2006/0108729 A1* | 5/2006 | Siegel | 269/266 |
| 2007/0103179 A1* | 5/2007 | Tsai et al. | 324/755 |
| 2008/0054926 A1* | 3/2008 | Lopez et al. | 324/760 |

FOREIGN PATENT DOCUMENTS

| | | |
|---|---|---|
| KR | 10-2005-0015340 A | 2/2005 |
| KR | 10-2005-0118886 A | 12/2005 |

\* cited by examiner

OPENER AND BUFFER TABLE FOR TEST HANDLER

TECHNICAL FIELD

The present invention relates to a test handler, and more particularly, to an opener for releasing a holding state of a holding apparatus mounted on a carrier board.

BACKGROUND ART

A test handler is equipment that allows a tester to test semiconductor devices fabricated by a certain fabricating process, sorts the semiconductor devices according to the test result, and loads the semiconductor devices onto customer trays. The test handler has been disclosed in many published documents.

The conventional test handler is configured in such a way to electrically connect semiconductor devices loaded onto a carrier board to a tester. More specifically, when the test handler receives a customer tray loading with semiconductor devices, it unloads the semiconductor devices from the customer tray onto a carrier board and then electrically connects the semiconductor devices loaded on the carrier board to the tester, so that the tester can test them. After that, the test handler sorts the tested semiconductor devices according to the test result and then unloads them from the carrier board onto a customer tray. The type of carrier board is classified into a test tray and a test board with sockets. The test tray is configured to be loaded with semiconductor devices, which is disclosed in Korean Patent Registration No. 10-608094, for example. The test board with sockets is configured to electrically connect semiconductor devices loaded thereon to a tester, which is disclosed in Korean Patent Application No. 10-2007-46265, filed with the KIPO by the present applicant.

The carrier board loads with semiconductor devices and circulates a certain circulation path. The carrier board includes a holding apparatus that holds semiconductor devices loaded thereon and prevents them from escaping during the circulation. Such carrier board is disclosed in Korean Patent Registration No. 10-486412.

This holding apparatus, however, requires an opener that releases a holding state of the holding apparatus when semiconductor devices are loaded onto or unloaded from the carrier board.

The opener includes a plurality of opening pins, as disclosed in Korean Patent Registration No. 10-687676, for example. These opening pins are formed in pairs and spaced apart at a certain distance. The holding apparatus releases its holding state as the opener ascends (or the carrier board descends).

DISCLOSURE OF INVENTION

Technical Problem

The carrier board loads with semiconductor devices and circulates a certain circulation path. The carrier board includes a holding apparatus that holds semiconductor devices loaded thereon and prevents them from escaping during the circulation. Such carrier board is disclosed in Korean Patent Registration No. 10-486412.

This holding apparatus, however, requires an opener that releases a holding state of the holding apparatus when semiconductor devices are loaded onto or unloaded from the carrier board.

The opener includes a plurality of opening pins, as disclosed in Korean Patent Registration No. 10-687676, for example. These opening pins are formed in pairs and spaced apart at a certain distance. The holding apparatus releases its holding state as the opener ascends (or the carrier board descends).

When the physical standard (dimension) of semiconductor devices to be tested is altered, the carrier board must be replaced (in the case of the conventional test tray, only the insert needs to be replaced). When the carrier board is replaced, the distance between a pair of holding apparatuses, which hold both sides of each of the semiconductor devices, is also altered. As a result, this replacement requires an alteration in the interval between the opening pins.

Therefore, when semiconductor devices are altered in dimension, the carrier board and the opener must be also replaced. In that case, the conventional technique increases the replacement cost and wastes resources.

Technical Solution

The present invention solves the above problems, and provides a technique related to an opener whose opening pins can adjust the interval therebetween, so that it can be adapted to a variety of carrier boards.

In accordance with an exemplary embodiment of the present invention, the present invention provides an opener for a test handler including: an opening plate; a plurality of pin blocks that are formed in pairs, are movably coupled to the opening plate, and include opening pins for releasing a holding state of a holding apparatus that holds semiconductor devices in a carrier board; and at least one or more interval retaining apparatus for retaining an interval between the pin blocks forming a pair.

Preferably, the opener may further include guide rods for guiding a movement of the plurality of pin blocks.

Preferably, each of the at least one or more interval retaining apparatus includes: an interval securing element for securing an interval between the pin blocks forming a pair; and an interval retaining element for retaining the interval that is secured by the interval securing element.

Preferably, the interval retaining element includes at least one or more elastic members for applying an elastic force to at least one of the pin blocks forming a pair.

Preferably, the interval retaining element is integrally formed with the interval securing element.

Preferably the interval retaining element is interval retaining protrusions that are integrally formed with the interval securing element. Here, the interval retaining protrusions are inserted into protrusion receiving grooves that are formed the pin blocks forming a pair.

In accordance with another exemplary embodiment of the present invention, an opener for a test handler including: an opening plate; pin blocks that are movably coupled to the opening plate, where each of the pin blocks includes opening pins for releasing a holding state of a holding apparatus that holds semiconductor devices in a carrier board; and a position determining apparatus for determining a position for the pin blocks, in which the position is arbitrarily selected and the pin blocks are located at the determined position.

In accordance with another exemplary embodiment of the present invention, a buffer table includes a placement table on which at least one or more placement compartments for receiving semiconductor devices are formed; and a placement area defining jig, detachably or movably coupled to the placement table, for defining a placement area of the placement table by using at least one inclined plane thereof, wherein the at lease one inclined plane is a part of the inclined planes that define the placement area.

Advantageous Effects

As described above, the opener according to the present invention can adjust the interval between the opening pins thereof when the size of each of semiconductor devices is altered. Therefore, the opener does not need to be replaced regardless of whether the size of semiconductor devices is altered, so that the waste of resources and the replacement cost can be reduced.

When the idea of the present invention is applied to a buffer table, the buffer table can adjust the place area according to the altered dimension of the semiconductor devices, which can reduce the waste of resources and the replacement cost.

Although exemplary embodiments of the present invention have been described in detail hereinabove, it should be understood that many variations and modifications of the basic inventive concept herein described, which may appear to those skilled in the art, will still fall within the spirit and scope of the exemplary embodiments of the present invention as defined in the appended claims.

BRIEF DESCRIPTION OF THE DRAWINGS

The features and advantages of the present invention will be more apparent from the following detailed description in conjunction with the accompanying drawings, in which.

BRIEF DESCRIPTION OF SYMBOLS IN THE DRAWINGS

100: opener
110: opening plate
120: pin block
130: guide rod
141: interval securing jig
142: spring

BEST MODE FOR CARRYING OUT THE INVENTION

Hereinafter, exemplary embodiments of the present invention are described in detail with reference to the accompanying drawings. The same reference numbers are used throughout the drawings to refer to the same or similar parts. Detailed descriptions of well-known functions and structures incorporated herein may be omitted to avoid obscuring the subject matter of the present invention.

Embodiment 1

Figure 1:
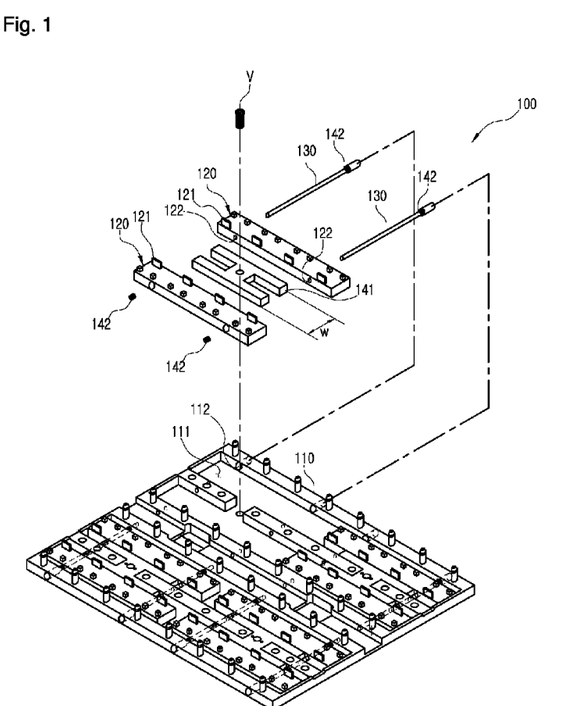
FIG. 1 is a partially exploded perspective view illustrating an opener according to a first embodiment of the present invention.
Figure 2:
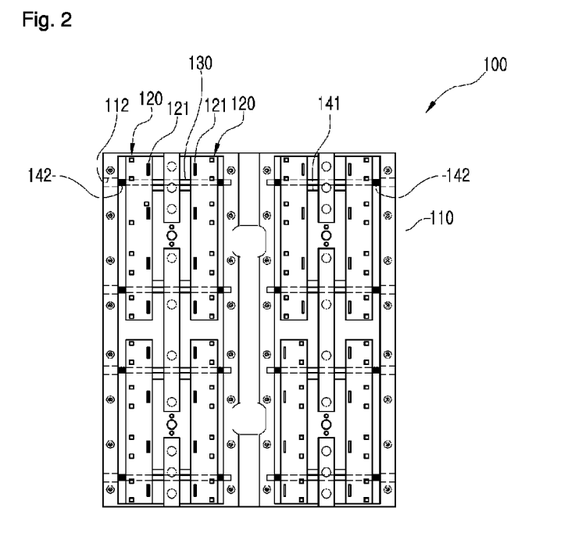
FIG. 2 is a conceptual plan view illustrating the opener of FIG. 1.

FIG. 1 is a partially exploded perspective view illustrating an opener 100 according to a first embodiment of the present invention and FIG. 2 is a conceptual plan view illustrating the opener 100 of FIG. 1.

As shown in FIGS. 1 and 2, the opener 100 includes an opening plate 110, a plurality of pin blocks 120, guide rods 130, and an interval retaining apparatus.

The opening plate 110 forms block receiving compartments 111. Each of the block receiving compartments 111 has an area in which one pin block 120 can be movably placed. The opening plate 110 forms holes 112 for securing the guide rods 130, where the guide rods 130 allow the pin blocks 120 to move therealong in block receiving compartments 111.

The plurality of pin blocks 120 are formed in pairs. The pin blocks 120 are inserted into the block receiving compartments 111 and are movably guided by the guide rods 130 therein.

Each of the pin blocks 120 includes opening pins 121. A pair of opening pins, which is formed by the opening pins 121 that are included in respective pin blocks 120 forming a pair, releases a holding state of a pair of holding apparatuses installed in a carrier board.

Each of the pin blocks 120 forms through-holes 122 through which the guide rods 130 pass.

The guide rods 130 are inserted into the holes 112 in a state where they pass through the through-holes 122 of the pin blocks 120, so that the pin blocks 120 are installed in the opening plate 110. The guide rods 130 serve to guide the movement of the pin blocks 120 and to movably couple the pin blocks 120 to the opening plate 110. It should be understood that the pin blocks and the block receiving compartments can have their shapes modified so as not to require the guide rods 130, so that the modified pin blocks can be movably coupled to the modified block receiving compartments of the opening plate.

The interval retaining apparatus serves to retain the interval between the pin blocks forming a pair. To this end, the apparatus includes an interval securing jig 141 and four springs 142 that are installed to both the sides of the guide rods 130.

The interval securing jig 141 is detachably coupled to the opening plate 110 by using bolts V. The jig 141 is placed between the pin blocks 120 forming a pair, so that the pin blocks 120 are spaced apart from each other at a width of the jig 141. As a result, the interval between a pair of opening pins 121, formed at the two pin blocks 120 forming a pair, can be secured. That is, the interval securing jig 141 serves as an interval securing element. Therefore, when the size of semiconductor devices to be tested is altered and the carrier board is accordingly replaced, only the interval securing jigs 141 can be replaced, each of which has a width corresponding to the distance between holding apparatuses forming a pair, which installed to the replaced carrier board. Consequently, the opener 100 according to the present invention does not need to be replaced because the pin blocks 120 forming pairs can be adjusted according to the interval therebetween.

As shown in FIG. 2, the four springs 142, made of elastic material, are installed to both the respective ends of two guide rods 130. The four springs 142 elastically push the pin blocks 120 to the interval securing jig 141 located between the pin blocks 120. The springs 142 applies their elastic forces to the pin blocks 120 forming a pair, so that the pin blocks 120 are fixed to the block receiving compartments and are spaced apart from each other with an interval that corresponds to the width W of the interval securing jig 141.

As described above, although the size of semiconductor devices to be tested is altered and the current carrier board is accordingly replaced with another carrier board whose holding apparatuses forming a pair are different from those of the current carrier board in terms of a distance between the holding apparatuses, the opener 100 according to an embodiment of the present invention allows the current interval securing jigs 141 to be replaced with other interval securing jigs whose interval corresponds to the distance of the holding apparatuses in the replaced carrier board. Therefore, the opener according to the present invention does not need to be replaced but can be applied to a replaced carrier board.

Application Example 1 of Embodiment 1

Figure 3:
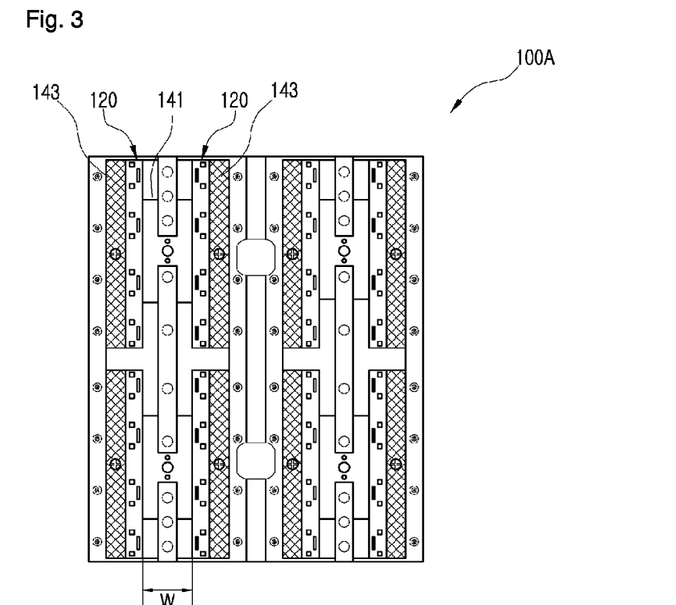
FIG. 3 is a conceptual plan view illustrating an opener according to a first application example of the first embodiment of the present invention.

Embodiment 1 was implemented in such a way to include the springs 142 serving as an elastic member used as an interval retaining element. In present application example 1, as shown in FIG. 3, the opener 100A includes a plurality of interval retaining jigs 143 instead of the springs. The plurality of interval retaining jigs 143 is used so that the pin blocks 120 forming each pair are spaced apart from each other with an interval that corresponds to the width W of the interval securing jig 141 and are fixed to the pin block receiving compartments. Therefore, although the current carrier board is replaced with another board, the opener 100A requires only the interval securing jigs 141 and interval retaining jigs 143 to be replaced, but does not need to be replaced itself. That is, the opener 100A can be applied to the replaced carrier board. It may be noted that the interval securing jig and the interval retaining jig are integrally formed.

Application Example 2 of Embodiment 1

Figure 4:
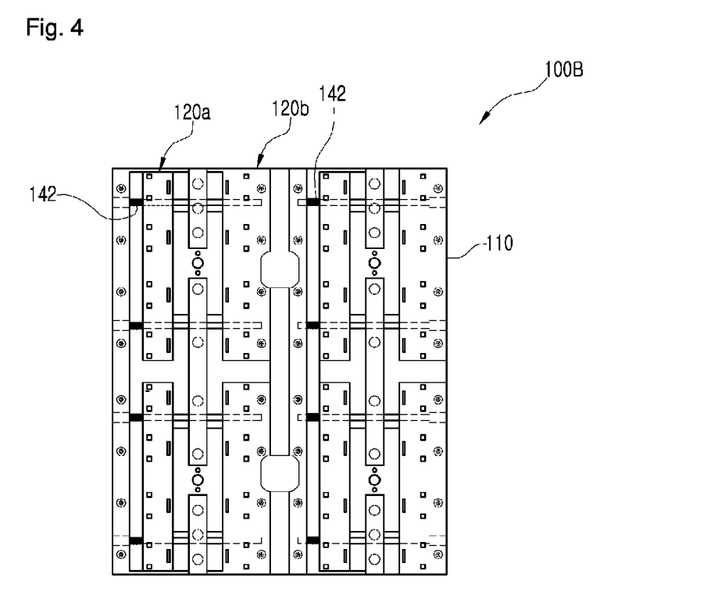
FIG. 4 is a conceptual plan view illustrating an opener according to a second application example of the first embodiment of the present invention.

Application example 1 of embodiment 1 was implemented in such a way that the pin blocks 120 forming a pair are movably connected to the opening plate 110. In the present application example 2, as shown in FIG. 4, the opener 100B is implemented in such a way that one of the pin blocks 120a and 120b forming a pair, for example a pin block 120b, is integrally formed with or fixed to the opening plate 110 and other pin block 120a is elastically supported by springs 142 and is movably connected to the opening plate 110.

As described in application example 2, the interval retaining apparatus serves as a position determining apparatus that determines the position of the pin block 120a located at other side.

In the embodiment described above, a pair of holding apparatuses installed to a carrier board simultaneously releases its holding state by a pair of opening pins. It will be easily appreciated that the embodiment is modified in such a way that the pair of holding apparatuses may simultaneously release its holding state by one opening pin. In that case, it is preferable to set a position to release the holding state of the pair of holding apparatuses installed to the replaced carrier board, as the pin blocks are moved to the position.

Embodiment 2

Figure 5:
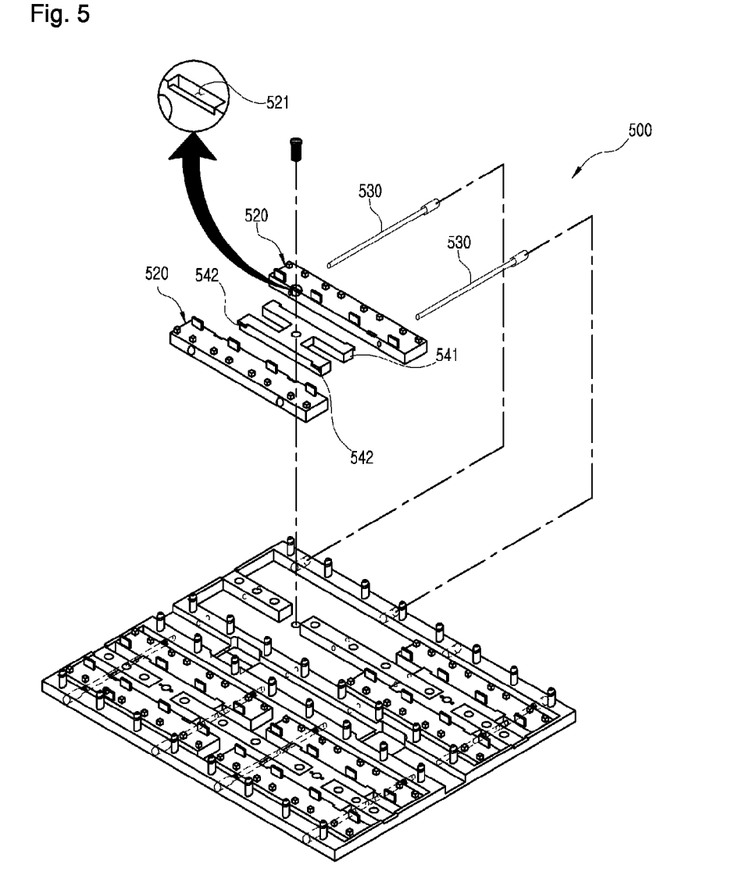
FIG. 5 is a partially exploded perspective view illustrating an opener according to a second embodiment of the present invention.
Figure 6:
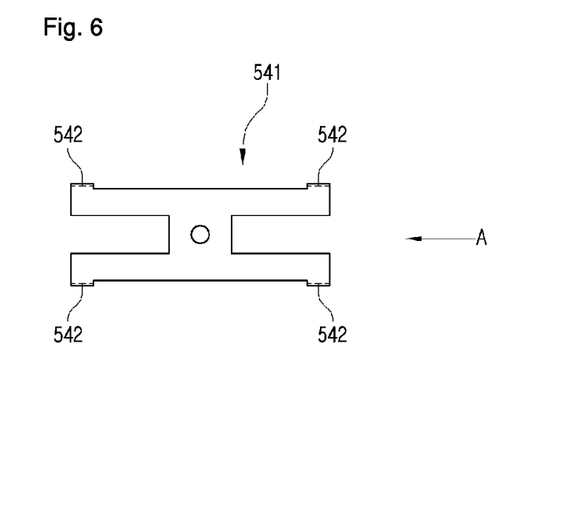
FIG. 6 is a plan view illustrating an interval securing jig included in the opener of FIG. 5.
Figure 7:
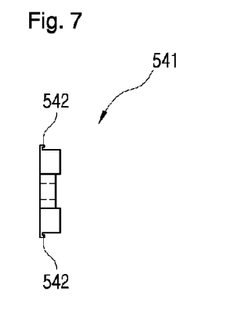
FIG. 7 is a side view illustrating the interval securing jig of FIG. 6, seen from direction A.

FIG. 5 is a partially exploded perspective view illustrating a second embodiment of an opener 500 according to the present invention. FIG. 6 is a plan view illustrating an interval securing jig 541 included in the opener 500 of FIG. 5. FIG. 7 is a side view illustrating the interval securing jig 541 of FIG. 6, seen from direction A.

Embodiment 1 was implemented to include the interval securing jig 141 and springs 142, used as an interval retaining apparatus. As shown in FIG. 5 and FIGS. 6 and 7, embodiment 2 is implemented in such a way that the interval securing jig 541 forms interval retaining protrusions 542 at both the ends thereof, respectively, and the pin blocks 520 forming a pair form protrusion receiving grooves 521 for receiving the interval retaining protrusions 542.

In embodiment 2, the interval retaining protrusions 542, used as an interval retaining element, are integrally formed at the interval securing jig 541 used as an interval securing element.

Similar to embodiment 1, embodiment 2 has application examples 1 and 2.

It will be easily appreciated that the guide rods 530 may not be used in embodiment 2.

In the embodiments described above, the opener is located under the carrier board. It should be understood that these embodiment can be modified in such a way that the opener is located above the carrier board, where the opener forms the opening pins on lower side thereof.

<Application of Buffer Table>

When semiconductor devices are altered in size, this size alteration requires that the placement compartment of a buffer table, installed to a loading part, must be also changed in size.

A buffer table is used to allow a pick-and-place apparatus to align the semiconductor devices, which are picked up from a customer tray, before the pick-and-place apparatus places the picked semiconductor devices onto the carrier board. The buffer table may have placement compartments whose number is greater than that of the semiconductor devices picked up by the pick-and-place apparatus. This is because semiconductor devices picked by the pick-and-place apparatus are to be temporarily loaded onto the placement compartments (or first placement compartments) formed at one side of the placement compartments (or second placement compartment). In general, when a problem (malfunction) has occurred at a certain contact socket of a tester, the pick-and-place apparatus does not load semiconductor devices onto the position corresponding to the malfunctioned (problematic) contact socket. Instead, the pick-and-place apparatus temporarily loads the semiconductor devices, intended to be loaded onto the malfunctioned contact socket, onto the second placement compartments.

Similar to the carrier board, when semiconductor devices are altered in size, the current buffer table must be replaced with another one. However, this causes an increase in the replacement cost and a waste of resources.

Therefore, when the buffer table employees the technique according to the present invention, adapted to the opener, the replacement cost and the waste of resources can be reduced.

Figure 8:
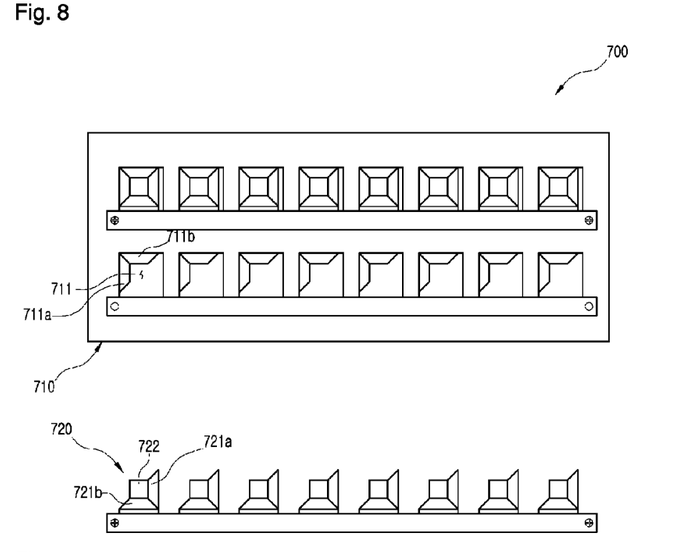
FIG. 8 shows plan views of a buffer table according to the present invention.

FIG. 8 is plan views illustrating the buffer table 700, to which the technique according to the present invention is applied, and a part disassembled from the buffer table 700.

As shown in FIG. 8, the buffer table 700 includes a placement table 710 and a placement area defining jig 720.

The placement table 710 forms a plurality of placement compartments 711 for receiving semiconductor devices. Each of the placement compartments 711 has a placement area that is defined by four inclined planes 711a, 711b, 712a and 712b. The two adjacent inclined planes 711a and 711b are integrally formed with the placement table 710. The other two adjacent inclined planes 712a and 712b and the bottom plane 722 are formed with the placement area defining jig 720. It will be appreciated that the embodiment can be modified in such a way to form the bottom plane in the placement table 710. When the placement area defining jig 720 is replaced with another jig, the placement area is accordingly altered, too. More specifically, when semiconductor devices are altered in terms of size, the current placement area defining jig 720 must be replaced with other placement area defining jig so as to change the current size of the semiconductor devices into the altered size of semiconductor devices. That is, since the placement area can be adjusted without replacing the current buffer table 700, the buffer table 700 does not need to be replaced.

Figure 9:
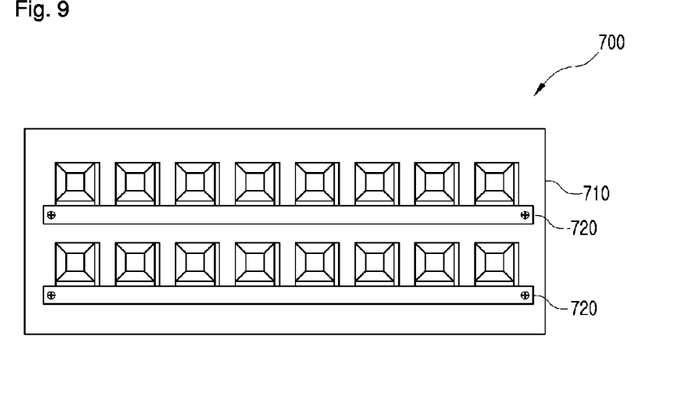
FIGS. 9 to 11 are plan views illustrating use states of the buffer table of FIG. 8.
Figure 10:
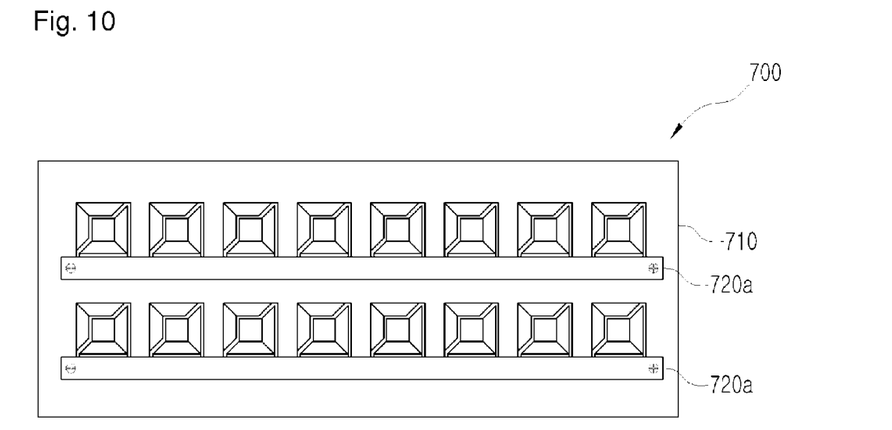
Figure 11:
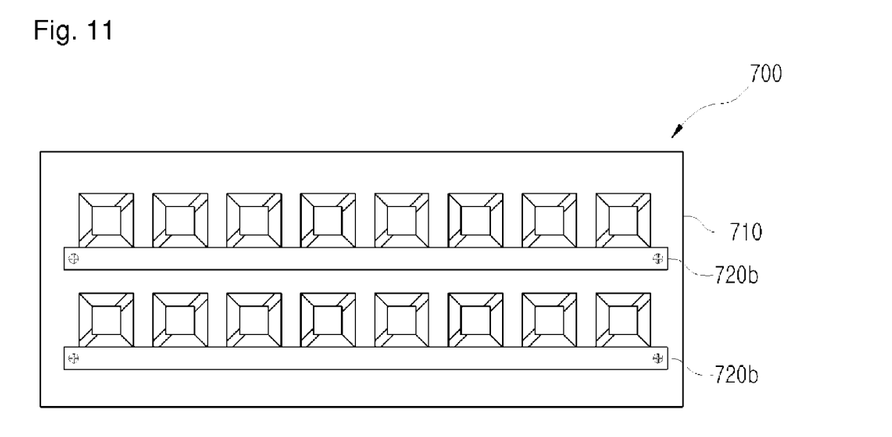

FIGS. 9 to 11 are plan views illustrating exemplary examples where the placement area defining jigs 720, 720a, and 720b, which are already standardized, are placed in the placement tables, respectively.

In the present embodiment, two inclined planes 721a and 721b are formed in the placement area defining jig 720. It will, however, be easily appreciated that the embodiment can be modified in such a way that only one inclined plane is formed with the placement area defining jig.

Figure 12:
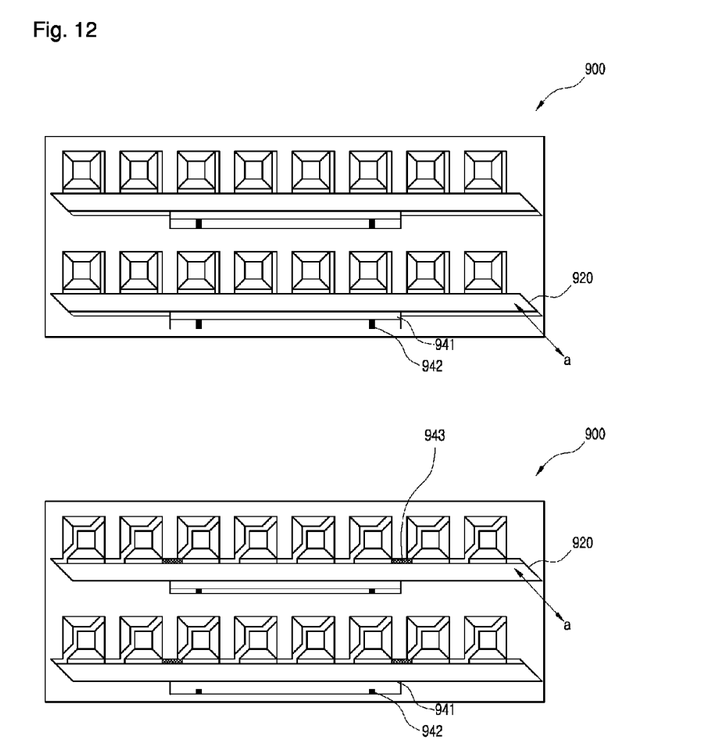
FIG. 12 and FIG. 13 are conceptual plan views illustrating a buffer table according to another application example of the present invention.

In addition, the present embodiment is implemented in such a way to replace the placement area defining jig 720. It will, however, be appreciated that the present embodiment, as shown in FIG. 12, can be implemented so that the placement area defining jig 920 is moved in the diagonal direction (i.e., the direction of arrow a) and a fixing apparatus for fixing the placement area defining jig 920 at the moved position is included. The fixing apparatus installed in the buffer table of FIG. 12 includes a pushing member 941, springs 942 and an interval securing jig 943.

The pushing member 941 elastically supports the placement area defining jig 920. The springs 942 applies an elastic force to the pushing member 941 in the direction of the placement area defining jig 920. The interval securing jig 943 is operated so that the placement area defining jig 920 cannot be not thrust by the pushing member 941 over a certain distance and a placement area is accordingly secured.

Figure 13:
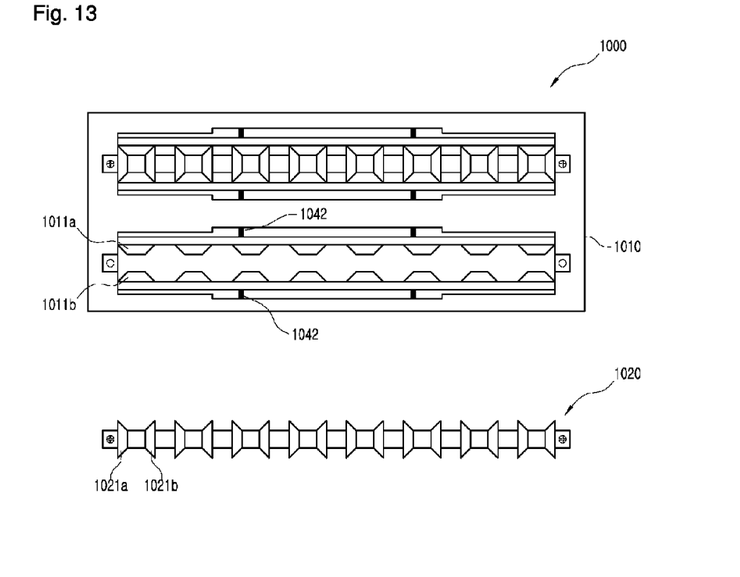

FIG. 13 is a conceptual plan view illustrating a buffer table 1000, according to another application example of the present invention, and a part disassembled from the buffer table 1000.

As shown in FIG. 13, two inclined planes 1011a and 1011b are located at the front and rear portions on the placement table 1010 and face each other. The two inclined planes 1011a and 1011b are electrically supported by the springs 1042, so that the inclined planes can move in the front and rear direction. The placement area defining jig 1020 forms inclined planes 1021a and 1021b that face each other in the right and left direction. Therefore, when the placement area defining jig 1020 is replaced with other one, the placement area can be adjusted. Here, in terms of the direction, the front and rear direction is referred to as a direction that is perpendicular to the right and left direction.

INDUSTRIAL APPLICABILITY

The present invention can be used in the field of testing the semiconductor device.

The invention claimed is:

1. An opener for a test handler comprising: an opening plate; a plurality of pin blocks that are formed in pairs, are movably coupled to the opening plate, and comprise opening pins fixed with the pin blocks for releasing a holding state of a holding apparatus that holds semiconductor devices in a carrier board; and at least one or more interval retaining apparatuses for retaining an interval between the pin blocks forming a pair, and comprising an interval securing element for securing an interval between the pin blocks forming a pair, wherein the interval securing element is placed between the pin blocks and detachably coupled to the opening plate, wherein the interval between the plurality of the pin blocks that are formed in pairs varies based on movement of each of the plurality of the pin block, wherein each of the at least one or more interval retaining apparatuses comprises an interval retaining element for retaining the interval that is secured by the interval securing element, and wherein the interval retaining element comprises at least one or more elastic members for applying an elastic force to at least one of the pin blocks forming a pair.

2. The opener according to claim 1, wherein the interval retaining element is integrally formed with the interval securing element.

3. An opener for a test handler comprising: an opening plate; a plurality of pin blocks that are formed in pairs, are movably coupled to the opening plate, and comprise opening pins fixed with the pin blocks for releasing a holding state of a holding apparatus that holds semiconductor devices in a carrier board; and at least one or more interval retaining apparatuses for retaining an interval between the pin blocks forming a pair, and comprising an interval securing element for securing an interval between the pin blocks forming a pair, wherein the interval securing element is placed between the pin blocks and detachably coupled to the opening plate, wherein the interval between the plurality of the pin blocks that are formed in pairs varies based on movement of each of the plurality of the pin block, wherein each of the at least one or more interval retaining apparatuses comprises an interval retaining element for retaining the interval that is secured by the interval securing element, wherein the interval retaining element is integrally formed with the interval securing element, and wherein the interval retaining element comprises interval retaining protrusions that are integrally formed with the interval securing element, in which the interval retaining protrusions are inserted into protrusion receiving grooves that are formed in the pin blocks forming a pair.

4. The opener according to claim 2 wherein the interval retaining element comprises interval retaining protrusions that are integrally formed with the interval securing element.

5. An opener for a test handler comprising: an opening plate; a plurality of pin blocks that are formed in pairs, are movably coupled to the opening plate, and comprise opening pins fixed with the pin blocks for releasing a holding state of a holding apparatus that holds semiconductor devices in a carrier board; and at least one or more interval retaining apparatuses for retaining an interval between the pin blocks forming a pair, and comprising an interval securing element for securing an interval between the pin blocks forming a pair, wherein the interval securing element is placed between the pin blocks and detachably coupled to the opening plate, wherein the interval between the plurality of the pin blocks that are formed in pairs varies based on movement of each of the plurality of the pin block, wherein the opening plate comprises block receiving elements to receive the plurality of pin blocks, wherein the opener further comprises: guide rods that pass through respective through holes of the plurality of the pin blocks that are formed in pairs to secure the plurality of the pin blocks to the opening plate; and springs that are formed on a first end of the guide rods and a second end of the guide rods.

6. The opener according to claim 5, wherein the springs that are formed on the first end of the guide rods and the second end of the guide rods push the plurality of pin blocks that are formed in pairs in opposing directions toward the interval retaining apparatus.

* * * * *